United States Patent
Bockrath (10) Patent No.: US 7,382,648 B2
(45) Date of Patent: Jun. 3, 2008

(54) NANOMECHANICAL SWITCHING DEVICE

(75) Inventor: Marc William Bockrath, Diamond Bar, CA (US)

(73) Assignee: California Institute of Technology, Pasadena, CA (US)

(*) Notice: Subject to any disclaimer, the term of this patent is extended or adjusted under 35 U.S.C. 154(b) by 292 days.

(21) Appl. No.: 11/239,355

(22) Filed: Sep. 30, 2005

(65) Prior Publication Data
US 2007/0230241 A1 Oct. 4, 2007

Related U.S. Application Data

(60) Provisional application No. 60/614,889, filed on Sep. 30, 2004.

(51) Int. Cl.
*G11C 11/50* (2006.01)
(52) U.S. Cl. .................. 365/164; 365/151; 365/166; 977/732; 977/943
(58) Field of Classification Search .......... 365/151, 365/164, 244, 165, 166; 977/724, 725, 943, 977/732, 752
See application file for complete search history.

(56) References Cited

U.S. PATENT DOCUMENTS

| | | | | |
|---|---|---|---|---|
| 6,473,351 | B2 * | 10/2002 | Tomanek et al. ........... | 365/215 |
| 6,636,433 | B2 * | 10/2003 | Tanikawa .................... | 365/36 |
| 6,874,668 | B2 * | 4/2005 | Cumings et al. ............ | 225/3 |
| 2006/0273871 | A1 * | 12/2006 | Busta et al. ................. | 335/78 |
| 2007/0171707 | A1 * | 7/2007 | Maslov et al. ........ | 365/185.01 |

OTHER PUBLICATIONS

Akita et al., "Interlayer Sliding Force of Individual Multiwall Carbon Nanotubes," Jpn. J. Appl. Phys., 2003, 42, 4830-4833.
Chiu et al., "Ballistic Phonon Thermal Transport in Multiwalled Carbon Nanotubes," Physical Review Letters, Nov. 25, 2005, PRL 95, 226101-1-226101-4.
Collins et al., "Current Saturation and Electrical Breakdown in Multiwalled Carbon Nanotubes," Physical Review Letters, Apr. 2, 2001, 86(14), 3128-3131.
Roukes, M., "Nanoelectromechanical systems face the future," Physics World, Feb. 2001, 14(2), 25 (web version, 20 pgs.).
Akita et al., "Interlayer Sliding Force of Individual Multiwall Carbon Nanotubes," The Japan Society of Applied Physics, Jpn. J. Appl. Phys. , vol. 42, Part 1, No. 7B, Jul. 2003, pp. 4830-4833.
Bourlon et al., "Carbon Nanotube Based Bearing For Rotational Motions," Nano Letters, American Chemical Society, vol. 4, No. 4, 2004, pp. 709-712.

(Continued)

*Primary Examiner*—Richard T. Elms
*Assistant Examiner*—Alexander G Sofocleous
(74) *Attorney, Agent, or Firm*—Foley & Lardner LLP (57) ABSTRACT

A nanomechanical device includes a nanostructure, such as a MWNT, located between two electrodes. The device switches from an OFF state to an ON state by extension of at least one inner shell of the nanostructure relative to at least one outer shell of the nanostructure upon an application of a voltage between the electrodes. If desired, the device may also switch from the ON state to the OFF state upon an application of a gate voltage to a gate electrode located adjacent to the nanostructure.

19 Claims, 5 Drawing Sheets

OTHER PUBLICATIONS

Cha et al., "Fabrication of A Nanoelectromechanical Switch Using A Suspended Carbon Nanotube," Applied Physics Letters, American Institute of Physics, vol. 86, 2005, pp. 083105(1-3).

Cho, "Researchers Race To Put The Quantum Into Mechanics," News Focus, Science, vol. 299, Jan. 3, 2003, pp. 36-37.

Collins et al., "Engineering Carbon Nanotubes and Nanotube Circuits Using Electrical Breakdown," Reports, Science, vol. 292, Apr. 27, 2001, pp. 706-709.

Cumings et al., "Low-Friction Nanoscale Linear Bearing Realized From Multiwall Carbon Nanotubes," Reports, Science, vol. 289, Jul. 28, 2000, pp. 602-604.

Fennimore et al., "Rotational Actuators Based on Carbon Nanotubes," Letters to Nature, Nature Publishing Group, vol. 424, Jul. 24, 2003, pp. 408-410.

Hudlet et al., "Evaluation of the Capacitive Force Between an Atomic Force Microscopy tip and A Metallic Surface," The European Physical Journal B, vol. 2, 1998, pp. 5-10.

Kim et al., "Nanotube Nanotweezers," Reports, Science, vol. 286, Dec. 10, 1999, pp. 2148-2150.

Kinaret et al., "A Carbon-Nanotube-Based Nanorelay," Applied Physics Letters, American Institute of Physics, vol. 82, No. 8, Feb. 24, 2003, pp. 1287-1289.

Poncharal et al., Electrostatic Deflections and Electromechanical Resonances of Carbon Nanotubes,: Reports, Science, vol. 283, Mar. 5, 1999, pp. 1513-1516.

Reulet et al., "Acoustoelectric Effects in Carbon Nanotubes," Physical Review Letters, The American Physical Society, vol. 85, No. 13, Sep. 25, 2000, pp. 2829-2832.

Rueckes et al., "Carbon Nanotube-Based Nonvolatile Random Access Memory For Molecular Computing," Reports, Science, vol. 289, Jul. 7, 2000, pp. 94-97.

Tombler et al., "Reversible Electromechanical Characteristics of Carbon Nanotubes Under Local-Probe Manipulation," Letters to Nature, McMillian Magazines Ltd., vol. 405, Jun. 15, 2000, pp. 769-772.

PowerPoint Slides Presented By Marc Bockrath on Jun. 6, 2004, at The Computing Beyond Summer School Lecture at Caltech, These PowerPoints Were Posted To The www.cs.caltech.edu/cbsss/pdf/bockrath/bockrath-slides.pdf website.

* cited by examiner

NANOMECHANICAL SWITCHING DEVICE

CROSS-REFERENCE TO RELATED PATENT APPLICATIONS

This application claims benefit of priority of U.S. Provisional Application Ser. No. 60/614,889, filed on Sep. 30, 2004. The above mentioned application is incorporated herein by reference in its entirety.

BACKGROUND OF THE INVENTION

The present invention relates generally to nanomechanical devices and specifically to a nanoelectromechanical switching devices.

Microelectromechanical structures have produced a plethora of novel devices for sensing, actuation, and lab-on-a-chip applications. Making smaller nanomechanical systems promises better, faster and more compact versions of their larger counterparts, opening up the possibility of highly-integrated nanoscale machines and logic circuits. However, many challenges, such as friction, remain important obstacles to the miniaturization of mechanical systems. Because of their mechanical stiffness and low inter-shell sliding friction, carbon nanotubes promise to address many of these challenges. Nanotube linear and rotational bearings have been demonstrated. Nanotube transistors with gate electrodes which regulate the flow of current through the nanotube channel have also been proposed. However, these previous approaches often require complex fabrication or geometries and do not necessarily provide devices which exhibit an improved overall performance compared to conventional semiconductor devices.

SUMMARY OF THE INVENTION

A nanomechanical device includes a nanostructure, such as a MWNT, located between two electrodes. The device switches from an OFF state to an ON state by extension of at least one inner shell of the nanostructure relative to at least one outer shell of the nanostructure upon an application of a voltage between the electrodes. If desired, the device may also switch from the ON state to the OFF state upon an application of a gate voltage to a gate electrode located adjacent to the nanostructure.

DETAILED DESCRIPTION OF THE EMBODIMENTS

According to one embodiment of the invention, a multi-walled nanostructure device includes a first electrode, a second electrode and a multi-walled nanostructure located between the first and the second electrodes to form an open circuit between the first and the second electrodes. The nanostructure is positioned such that an inner portion of the nanostructure is adapted to extend relative to an outer portion of the nanostructure to close the open circuit upon an application of a voltage between the first and the second electrodes.

Any suitable multi-walled nanostructure may be used in the device. Preferably, the nanostructure is a multi-walled carbon nanotube (MWNT), such as a metallic or semiconducting nanotube. Multi-walled carbon nanotubes have two or more concentric walls or shells. However, other multi-walled nanostructures may also be used. For example, multi-walled nanotubes made from materials other than carbon, may be used. Furthermore, multi-walled nanotube-like nanostructures such as nanohorns, nanorods, nanoribbons and Y-shaped nanotubes may also be used, as long as these nanostructures comprise concentric walls or shells and the interior walls or shells can extend or telescope out relative to the outer shells or vice-versa.

Figure 1:
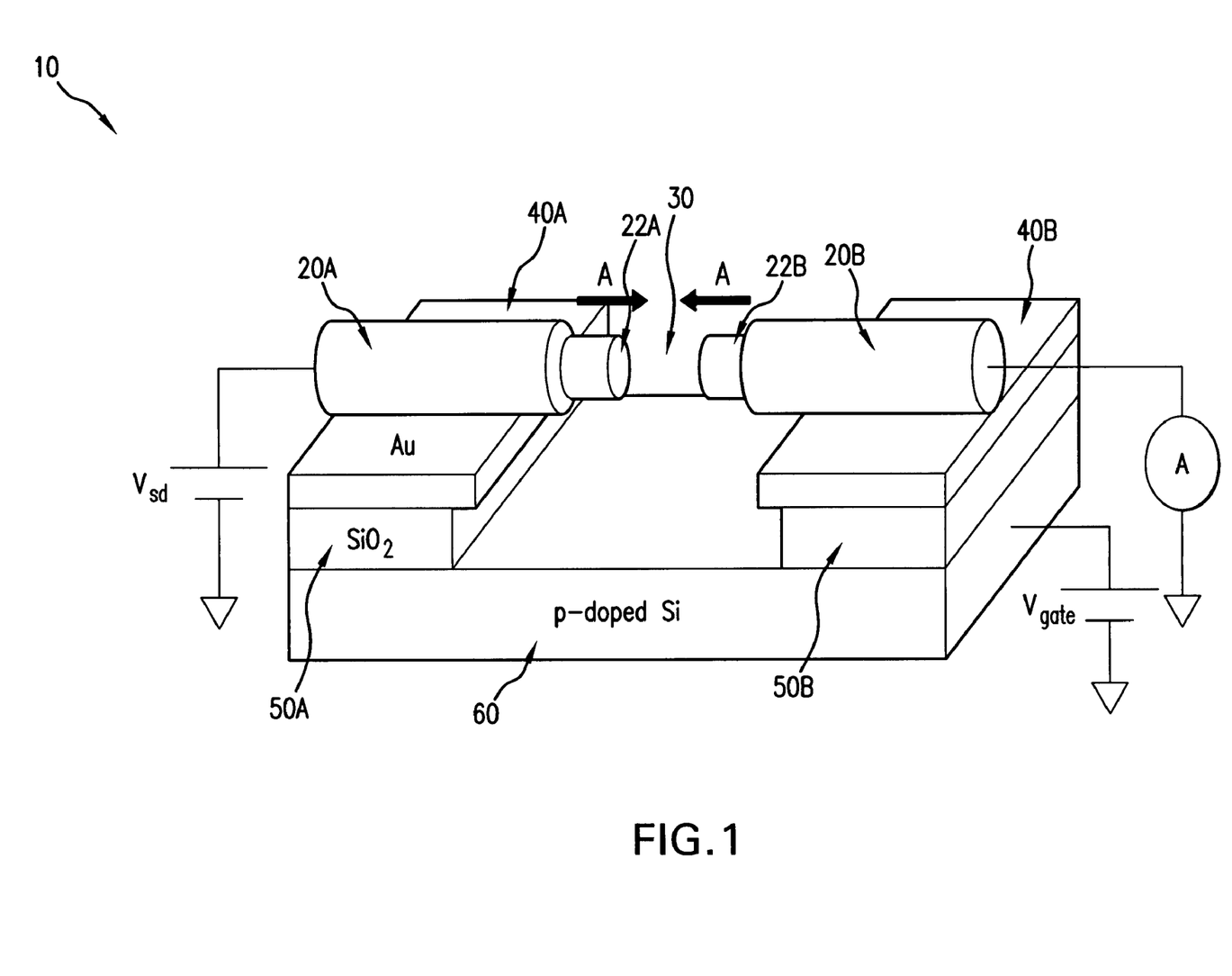
FIG. 1 is a perspective view of a nanomechanical relay according to an embodiment of the present invention.
Figure 2:
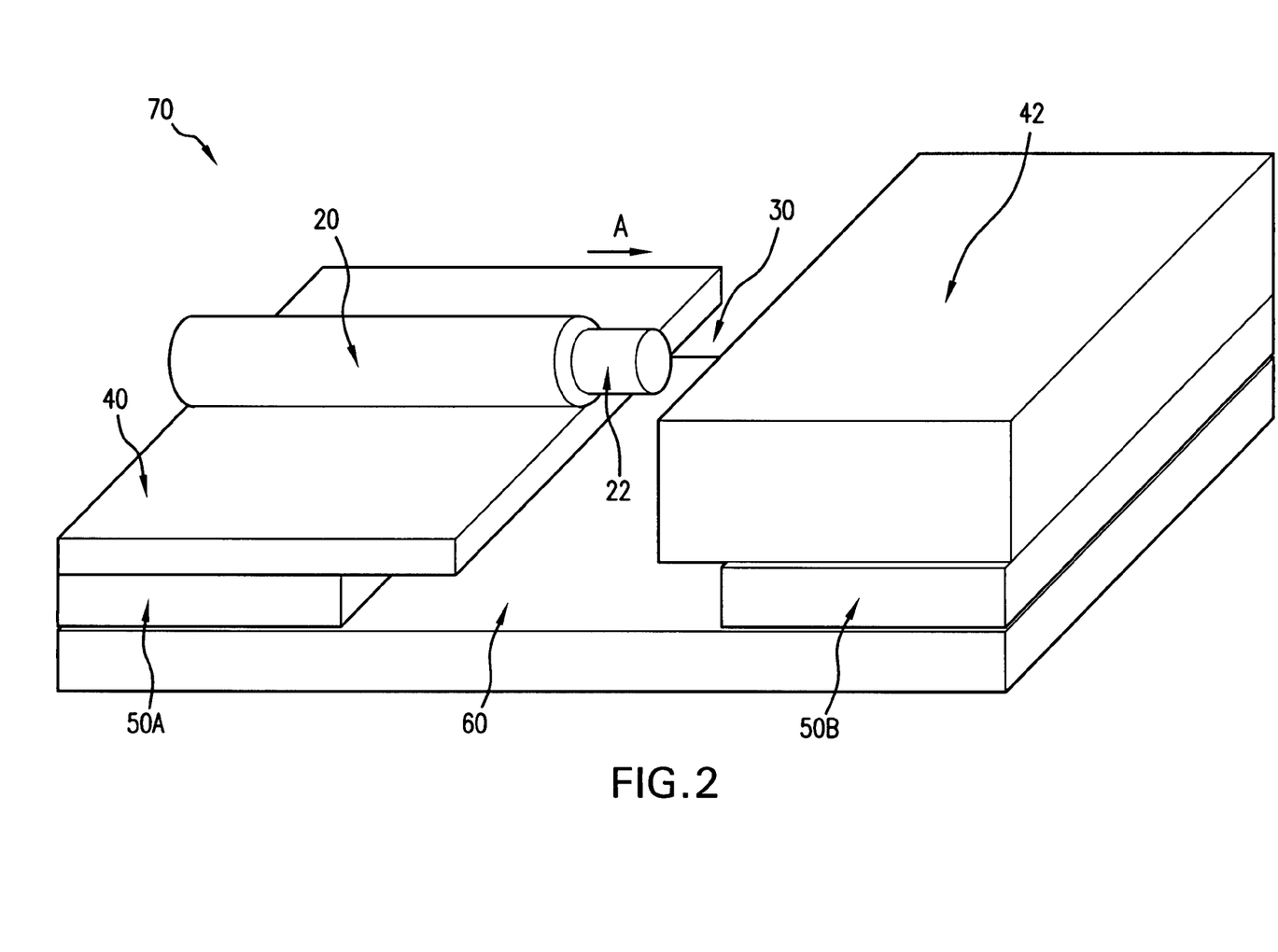
FIG. 2 is a perspective view of a nanomechanical relay according to an embodiment of the present invention.

FIGS. 1 and 2 illustrate alternative embodiments of a nanomechanical device to illustrate different ways that an open circuit may be converted to a closed circuit. In the example of FIG. 1, the nanostructure comprises a carbon MWNT.

FIG. 1 shows a perspective view of a nanomechanical device 10 according to a first embodiment of the present invention. The nanomechanical device 10 includes two MWNT segments 20A, 20B that face one another so that a nanoscale gap 30 is formed between the ends (i.e., the bases of the cylinder) of the MWNT segments 20A, 20B. The gap 30 is preferably wider than 1 nm, and may have a width of about 2 to about 10 nm, such as about 5 nm, for example. Each segment 20A, 20B of the MWNT is in electrical contact with a respective electrode 40A, 40B. The MWNT segments may be located above the respective electrodes, as shown in FIG. 1, or below the respective electrodes, to make the electrical contact. While the device 10 is shown with one MWNT comprising two segments, the device may have two or more MWNTs located between the electrodes, with each MWNT comprising two segments.

The electrodes 40A, 40B may be referred to as source and drain electrodes for convenience, even though the device 10 does not necessarily act as transistor. The electrodes may comprise any suitable electrically conductive material, such as a metal, including but not limited to gold, chromium, copper and aluminum and/or their alloys. The gap 30 between the MWNT segments 20A, 20B causes an open circuit between the electrodes 40A, 40B.

The MWNT segments 20A, 20B may be suspended over a substrate 60 from pillars 50A, 50B located below the electrodes. The pillars 50A, 50B may comprise any material which can support the MWNT segments and the electrodes. For example, the pillars may comprise an insulating material, such as silicon oxide or silicon nitride formed over the substrate 60. Alternatively, the pillars may comprise the same material as the substrate and may be formed by etching a trench in the substrate to leave behind the pillars. If desired, the pillars may be omitted.

The substrate 60 may comprise any suitable supporting material. For example, the substrate 60 may comprise a semiconductor substrate, such as a silicon wafer, or a metal, ceramic, glass, quartz or plastic substrate. The substrate 60 may comprise one or more layers.

The nanomechanical device 10 may further include an optional gate electrode for applying a gate voltage to the MWNT segments. When a conducting or a highly doped semiconducting substrate is used, such as a heavily doped silicon substrate, then substrate 60 itself may act as a gate electrode, as shown in FIG. 1. Alternatively, conductive layer, such as an aluminum, copper or heavily doped polysilicon layer may be formed on the substrate 60 to act as the gate electrode. The gate layer may be located on the substrate 60 below the suspended MWNT and insulated from the source and drain electrodes 40A, 40B by the insulating pillar 50A, 50B material. Alternatively, the gate electrode may comprise a heavily doped region formed in a semiconductor substrate 60 below the suspended MWNT. If desired, the gate electrode may also be formed above the MWNT or adjacent to the side of the MWNT rather than below the MWNT. Preferably, the gate electrode is separated from the MWNT by a gap.

The device 10 operates as follows. A voltage is applied between the source and drain electrodes 40A, 40B from any suitable voltage source, such as a battery or a circuit which converts a voltage from a power outlet. Upon the application of the voltage, the inner portion, such as one or more inner shells 22A, of the first MWNT segment 20A extends relative to the outer MWNT portion, such as one or more outer shells, of the first segment 20A. Likewise, the inner portion 22B of the second MWNT segment 20B extends relative to the outer portion of the second segment. The sliding movement of the inner MWNT portions 22A, 22B of the respective MWNT segments 20A, 20B results in a contact between the inner portion 22A of the first segment 20A and the inner portion 22B of the second segment 20B to electrically connect the first electrode 40A to the second electrode 40B. Thus, the open circuit is converted to a closed circuit. In other words, an electrostatic force is applied to the MWNT segments 20A, 20B by the electrodes 40A, 40B to cause the inner shells 22A, 22B of the MWNT segments 20A, 20B to extend in the direction indicated by the arrows "A" in FIG. 1 so that the inner shells 22A, 22B of each respective MWNT segment 20A, 20B come into contact, restoring electrical contact between the electrodes and producing an ON state.

FIG. 2 shows a perspective view of a nanomechanical device 70 according to a second embodiment of the present invention. In the example shown in FIG. 2, the nanomechanical device includes a MWNT 20 whose end or cap portion has been opened (i.e., cleaved or cut off). The MWNT 20 is electrically connected to an electrode 40. The MWNT is arranged opposite to a contact electrode 42 such that a nanoscale gap 30 is formed between the end of the MWNT 20 and the contact electrode 42. If desired, one or both electrodes 40, 42 may be on formed pillars 50A, 50B to suspend the MWNT 20.

The device 70 operates as follows. The inner portion 22 of the MWNT extends relative to an outer portion of the MWNT to contact the contact electrode 42. This movement electrically connects electrode 40 to the contact electrode 42 to close the open circuit between the electrodes. In other words, when the MWNT 20 is actuated by electrostatic force that is applied through the electrode 40, one or more inner shells 22 of the MWNT 20 extend and come into contact with the contact electrode 42, restoring electrical contact between the electrodes and producing an ON state.

Thus, it is apparent that the devices 10, 70 of the first and second embodiments function as an antifuse. In other words, the function of these nanomechanical devices is similar to a semiconductor antifuse, which contains an insulating antifuse layer between two conductive electrodes. When a programming voltage is applied across the insulating antifuse layer, a conductive link is formed between the electrodes to provide a conductive path between these electrodes. However, unlike the semiconductor antifuse which causes a breach of the insulating antifuse layer and damage to the surrounding regions of the device, the nanomechanical fuse of the first and second embodiments relies on nanomechanical bearing motion of a nanostructure across the gap 30 to avoid damage to surrounding regions. Thus, the devices 10, 70 of the first and second embodiments may act as memory devices, such as non-volatile memory devices by switching their state from OFF to ON due to an application of voltage. Furthermore, the devices 10, 70 may also function as a contact probe to either grasp an object between nanostructure segments or to make contact to a contact electrode, respectively.

In a third embodiment, the nanomechanical devices 10, 70 operate as a fuse. In other words, the devices function similar to a semiconductor fuse device in which a current is passed through a resistor connecting two electrodes causing the resistor to melt and thus disconnect the electrodes from each other. However, unlike the semiconductor fuse which causes a breach of the resistor layer and damage to the surrounding regions of the device, the nanomechanical fuse of the third embodiment relies on nanomechanical motion of a nanostructure to avoid damage to surrounding regions. A typical resistance of a one micron-long individual MWNT nanotube device is about ten to about twenty thousand Ohms. The device resistance could be reduced using multiple nanotubes in parallel. However, this would increase the current carrying capacity required for failure and may impact the type of load that could be used in series with the fuse.

In the third embodiment, a gate voltage is applied to the gate electrode 60 which is located adjacent to the MWNT to overcome adhesion forces between MWNT segments 20A, 20B in device 10 or between the MWNT 20 and an electrode 42 in device 70, and to cause a bending motion of the nanostructure to open the closed circuit. It is believed that the MWNT segments 20A, 20B of device 10 or the MWNT 20 of device 70 will bend toward the gate electrode 60 upon the application of the gate voltage. Thus, the nanostructure which contains a weak contact region between its inner shell(s) and the opposing nanostructure segment or contact electrode creates an open circuit between the electrodes by reforming the nanoscale gap 30 due to bending of the nanostructure. In isolated cases, when the electrostatic force is released (i.e., when the voltage between the source and drain electrodes is terminated), the inner shell(s) 22A, 22B in the two MWNT segments 20A, 20B may retract back into the outer shell(s) to reform the gap 30 without an application of the gate voltage. In this case, the device acts as a volatile memory.

Thus, a nanomechanical device of the third embodiment includes a source electrode, a drain electrode, a nanostructure located between the source electrode and the drain electrode, and a gate electrode located adjacent to the nanostructure. An application of a gate voltage causes the nanostructure to move to change a closed circuit to an open circuit between the source electrode and the drain electrode. It should be noted that the device of the third embodiment is not necessarily limited to a multi-walled nanostructure.

For example, single walled nanostructures, such as single walled carbon nanotubes (SWNTs) may also be used if the SWNT is formed with a weak contact. For example, the SWNT may be formed to comprise two contacting segments 20A, 20B electrically connected to respective electrodes 40A, 40B or two separate but contacting SWNTs 20A, 20B may be electrically connected to respective electrodes 40A, 40B, similar to the set up shown in FIG. 1. An application of a gate voltage would cause the SWNT segments or the separate SWNTs to move apart to create a gap 30 between them and thus to change a closed circuit to an open circuit. Alternatively, the SWNT may be permanently attached to one electrode and temporarily or weakly contact a second electrode, thus forming a weak contact at the second electrode. The SWNT 20 may be formed to contact the second electrode 42 with its tip, similar to the arrangement shown in FIG. 2. An application of a gate voltage would cause the SWNT to move away from the second electrode to change a closed circuit to an open circuit between the electrodes.

In a fourth embodiment of the invention, the device functions as a three terminal reversible fuse—antifuse device. In other words, the devices 10, 70 first function as antifuse devices to form a conductive link between the electrodes and set the device to the ON state. Then, a gate voltage is applied to the gate to bend the nanostructure such that the conductive link is breached to set the device into the OFF state. This reversible operation may be repeated a plurality of times to change the device state from ON to OFF and vice versa a plurality of times. This type of device may also be called a relay device, which is a movable device which is actuated by a voltage and which changes a conductance of a circuit one or more times.

The devices of the embodiments of the invention may be incorporated into a non-volatile memory comprising an array of nanomechanical devices (i.e., the antifuses, fuses or the reversible fuse-antifuse relays). The devices may be arranged in a grid similar to semiconductor fuse and antifuse arrays. The memory may also contain a bit line driver circuit which adapted to selectively provide a voltage between the selected bit lines which are arranged in a plurality of columns. Each bit line contacts one or more electrodes 40A, 40B, such that the MWNT forms a closed or open circuit between adjacent electrodes and thus between adjacent bit lines. The voltage applied to the electrodes through the bit lines provides a conductive MWNT link between the adjacent electrodes (and thus between adjacent bit lines contacting the electrodes) in predetermined devices in the array. Optionally, the memory may also contain a word line driver circuit which is adapted to selectively provide a voltage to selected word lines. The word lines are connected to selected gate electrodes or portions of the word lines located near the MWNTs function as gate electrodes. The gate voltage bends the nanostructures in predetermined devices in the array in order to cause an open circuit between the bit lines in these devices. These driver circuits may be similar to the driver circuits in conventional semiconductor fuse and antifuse arrays.

The nanomechanical devices may be fabricated using any suitable method. In one method, the nanostructure may be formed on a sacrificial layer over a substrate, followed by formation of the electrodes in contact with the nanostructure, followed by the selective etching of the sacrificial layer located below the nanostructure and exposed between the electrodes to suspend the nanostructure between the electrodes. For example, a sacrificial insulating layer, such as a 200 to 500 nm silicon oxide or silicon nitride layer is formed over a substrate, such as a 300 nm $SiO_2$ sacrificial layer formed on a heavily doped Si wafer. Then, discharge synthesized MWNTs (dispersed in 1,2-dichloroethane) are deposited on the sacrificial layer. Then, Cr/Au contacts/electrodes are evaporated on the MWNT. Finally, a 10:1 buffered HF solution is used to etch away the oxide sacrificial layer between the electrodes to suspend the MWNT. The portions of the sacrificial layer remaining below the electrodes form the pillars 50A, 50B.

In an alternative method, the nanostructure is formed on top of the electrodes as shown in FIG. 1. For example, a sacrificial insulating layer, such as a 200 to 500 nm silicon oxide or silicon nitride layer is formed over a substrate, such as a 300 nm $SiO_2$ sacrificial layer formed on a heavily doped Si wafer. Then, Cr/Au contacts/electrodes are evaporated on the sacrificial layer. The sacrificial oxide layer is then etched with 10:1 buffered HF using the electrodes as a mask. The MWNT is then deposited between the electrodes such that the MWNT remains suspended between the electrodes, as shown in FIG. 1.

The gap 30 between the MWNT segments 20A, 20B may be formed by the electrical breakdown method which is described in Collins, Arnold, and Avouris, "Engineering Carbon Nanotubes and Nanotube Circuits Using Electrical Breakdown", Science, 292 (2001) 706, which is hereby incorporated by reference. Briefly, this method involves passing a large current through a nanotube to successively break down each outer most shell in a weak region until a nanoscale gap is formed between two MWNT segments.

Thus, nanomechanical devices that preferably use multiwalled nanotubes have been described. The nanomechanical devices may include two open-ended MWNT segments that are separated by a nanometer scale gap. A sufficient voltage may be applied across the gap to cause the inner shells of the nanotubes to slide relative to their outer shells and make contact, yielding an extraordinarily large ON/OFF ratio. Furthermore, a gate electrode may be included to provide a gate voltage for switching the joined devices back to an insulating OFF state, enabling repeated switching of the device conductance. Thus, the device is actuated with electrostatic forces so that the inner shells in two MWNT segments slide together and bridge the gap between the MWNT segments, restoring electrical contact and producing an ON state. Adhesion forces between the nanotube ends, or between a nanotube end and an electrode, may maintain the conductive state until an insulating state is controllably restored by using a gate voltage to overcome the adhesion force and separate the nanotube ends, or nanotube and electrode. This use of the gate electrode allows repeated ON/OFF cycles. This nanomechanical device may be used as a three-terminal non-volatile memory device or in other applications.

SPECIFIC EXAMPLES

The following specific examples and calculations are provided to illustrate examples of nanomechanical devices of the embodiments of the invention and should not be considered limiting on the scope of the claimed invention. Device behavior has been modeled by considering the balance of electrostatic forces tending to close the device and restore the conductance and the retraction force from the inter-tube van der Waals forces. A fit of a model to data yields an estimate for the inner shell retraction force, which agree with theoretical calculations as well as the results from atomic force microscopy (AFM) measurements. Specifically, as will be described below, an analysis of data yields a retraction force constant of about 1 N/m, which agrees with theoretical calculations as well as atomic force microscopy (AFM) measurements. Results indicate that the intratube electrostatic repulsion typically makes a significant contribution to actuating the bearing motion. Finally, estimates of the switching speed of the devices show sub-nanosecond switching times for typical device geometries (1 μm length, ~10 nm diameter) employed in experiments, with considerable scope for further optimization of switching speed by using shorter and thinner nanotubes.

Figure 3:
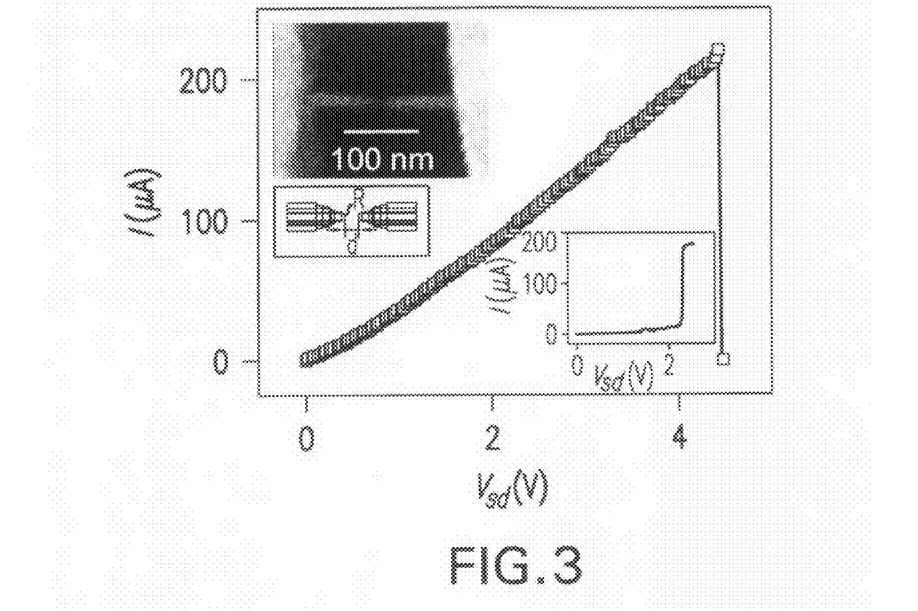
FIG. 3 is a graph depicting the IV characteristics of a sample device leading to electrical breakdown, according to an embodiment of the present invention.

Samples were prepared and tested. MWNT samples were obtained from Professor L. Forro's group in Lausanne, Switzerland. Samples typically had an initial resistance ranging from ~10 kΩ to a few MΩ. A sufficiently high voltage V across the higher-resistance samples usually resulted in a rapid drop in resistance, as shown by the step-like feature at V~2.2 V in the current-voltage data in FIG. 3 (lower inset), taken from a representative device referred herein to as "D2". The inset on the lower right of FIG. 3 shows a rise in conductance of device D2 from annealing due to self-heating. A detailed analysis reveals that this annealing process likely arises from the self-heating of the nanotube in conjunction with current flow. This phenomenon creates low-resistance nanotube devices with resistances of ~10-20 kΩ from nearly all contacted nanotubes. FIG. 3 shows an IV curve of a sample taken in an Ar atmosphere from a different device (referred to herein as "D1") that has already been pre-annealed. The current rises approximately linearly until V~4.3 V at which point I dropped to zero. This observation is consistent with previous work of Collins et al. (Phys. Rev. Lett. 86 (2001) 3128, incorporated herein by reference) in which heating and electrical stress result in the successive breakdown of the nanotube shells. Indeed, an SEM image shown in the upper left inset of FIG. 3 shows two segments with tapering ends, with each segment consisting of 10-30 shells, separated by a gap, d, of about 5 nm. Once a gap forms, the device is in an insulating OFF state, consistent with expected negligible tunnel current for electrode separation exceeding ~1-2 nm.

Figure 4:
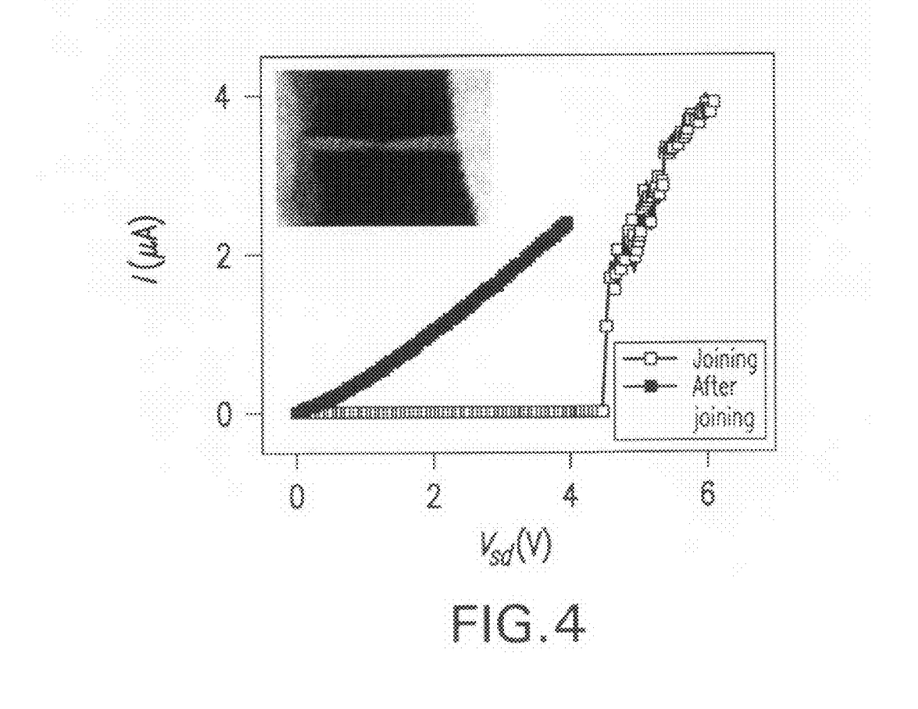
FIG. 4 is a graph depicting the IV characteristics of a sample device showing an abrupt rise in conductance on application of $V_{sd}$, and subsequent latching of the nanotube segments, according to an embodiment of the present invention.

In another test, on application of a higher bias (typically in the range 5-10 V) to device D1 in the OFF state, at a voltage $V_c$=4.6 V (FIG. 4) the current increased abruptly, leading to a conductive ON state. Once the bias was reduced to 0 V, the device D1 remained latched in this ON state, showing a finite zero-bias resistance. (Hysteretic IV characteristics where the devices turn back off again at lower voltages occur frequently, although the latching behavior observed in device D1 may occur after a few cycles). The SEM image of the sample in device D1 in the latched ON state (FIG. 4 inset) showed that the gap had vanished, indicating nanomechanical motion of the nanotube shells to physically rejoin the two nanotube segments and complete the electrical circuit. This demonstrated that the device acts as a voltage-actuated switch.

To understand this behavior, the linear bearing model of Cumings and Zettl (J. Cumings et al., Science, 289 (2000) 602, incorporated herein by reference) may be used to model the van der Waals force between shells within the MWNT. The bearing is expected to act as a constant-force spring, i.e. independent of the extended length, with the expected retraction force $F_R = \alpha R_c$, with $R_c$ the extended core radius and $\alpha$~1 N/m a constant. To close the circuit, $F_R$ must be overcome by the electrostatic force due to the applied voltage. To model the electrostatic force, the MWNT segments are approximated with a cone for the tapered part, and a spherical cap at the tip (FIG. 3 lower left inset). The geometric parameters for this model (cap radius R, gap d, cone half-angle θ) are carefully extracted from the SEM images using a MATLAB image-processing program.

The two main force contributions arise from electrostatic attraction between the segments and intra-shell electrostatic repulsion within a segment. Both of these forces tend to slide one or more shells out to close the gap. It is most straightforward to estimate these for the case where the two segments are far apart (R<<d). In this case, the attractive force between segments (considered to be point charges for this evaluation) is $\pi\epsilon_0 V^2 R^2/(d+2R)^2$ while the repulsive force within a segment (modeled as force between two halves of a charged sphere) is $\pi\epsilon_0 V^2$. The force balance gives:

$$\alpha R = \pi\epsilon_0 V^2 \left[ \frac{R^2}{(d+2R)^2} + 1 \right]$$

Figure 5:
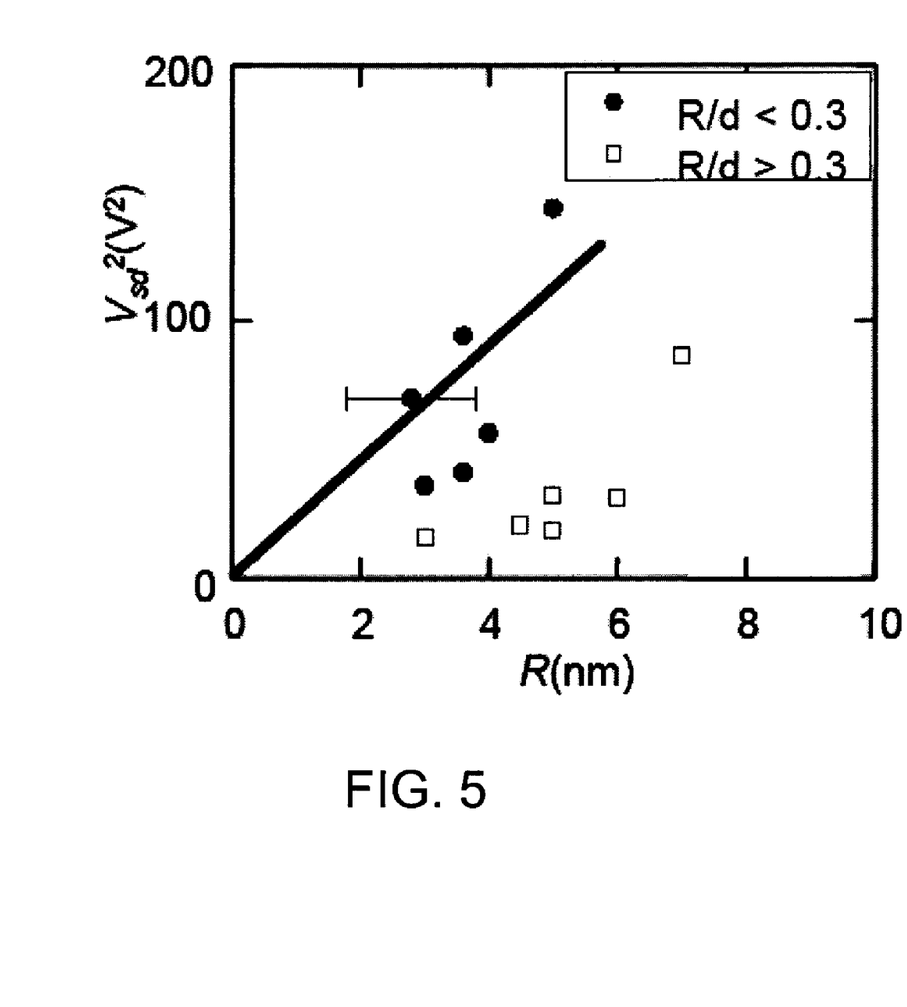
FIG. 5 is a plot of $V_{sd}^2$ vs. R, showing samples with nanotube segments close-in are actuated at lower $V_{sd}$ than those with segments which are well separated, according to an embodiment of the present invention.

Plotting $V^2$ vs. of R for data points with R/d<<1 should thus yield a straight line with a slope $\alpha/\pi\epsilon_0$. The solid circles in FIG. 5 correspond to points with R/d<0.3. Fitting a straight line to these points yields a slope of $2\times10^{10}$ V²/m. From this it is estimated α~0.5 N/m, in reasonable agreement with the theoretical value ~1.0 N/m and the value obtained from previous AFM measurements (see A. Seiji et. al., Jpn. J. Appl. Phys. 42 (2003) 4830, incorporated herein by reference). This demonstrates that for R/d in this range the dominant actuation force comes from the intra-tube repulsive forces rather than the inter-tube attractive forces. For data with R~d, shown by the open squares in FIG. 5, the data falls below the line, signifying a smaller voltage to overcome the van der Waals forces for a given R. Although accurate modeling of the electrostatics for R~d is challenging, it is expected that in this regime both the electrostatic intra-tube repulsion and inter-tube attraction are ~$\pi\epsilon_0 V$, leading to a smaller closing voltage than in the R<<d regime, as observed.

Figure 6:
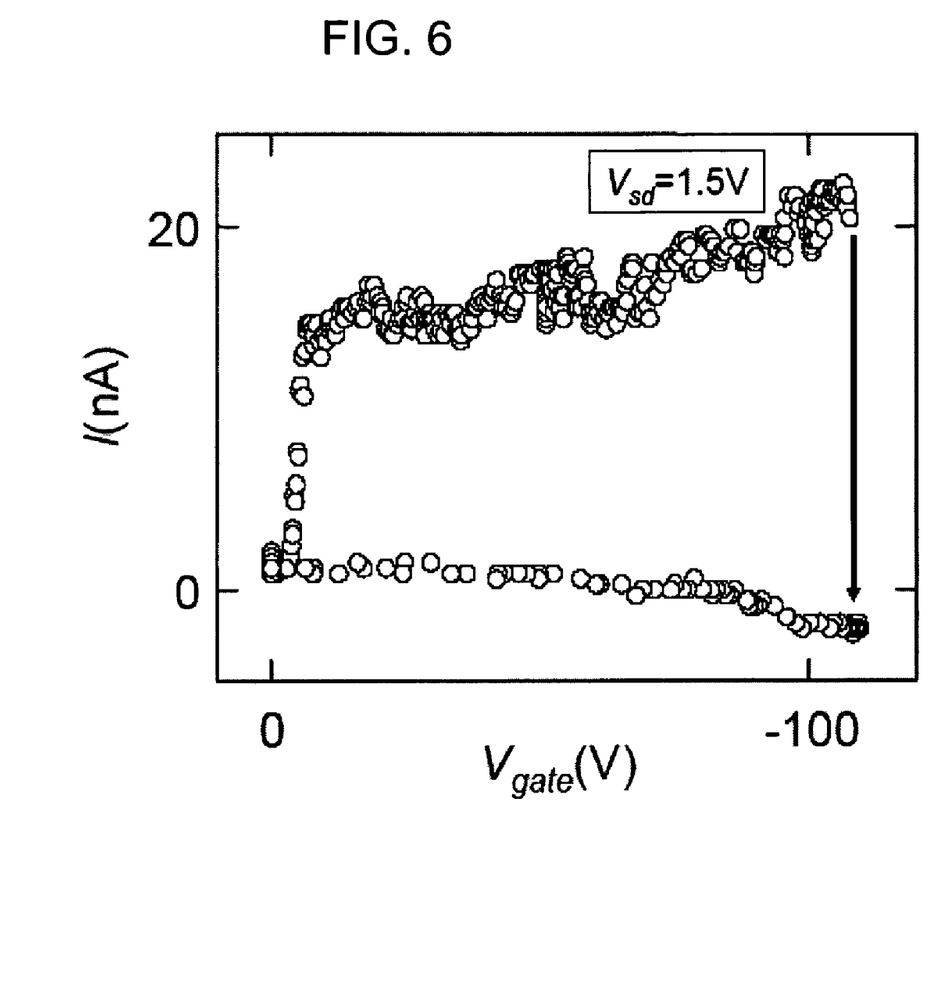
FIG. 6 is a plot showing the current(I) vs. gate voltage ($V_{gate}$) at $V_{sd}$=1.5 V for a semiconducting DWNT device, according to an embodiment of the present invention.

The above procedure of electrical breakdown and closing of gap with bias voltage may be applied to double wall nanotubes (DWNTs) as well. A sample DWNT device referred to herein as "D3" was prepared as follows. DWNTs were obtained commercially from Aldrich, and had a typical diameter d~3-6 nm. Using the p-doped Si wafer as a back gate in these samples, it was found that sufficiently high gate voltage devices switch back to OFF state. FIG. 6 shows the effect of a gate voltage on a DWNT device. In the ON state, with V=0.1 V, $V_g$ is ramped to large negative values. At low $V_g$, resulting I increased, demonstrating p-type semiconducting behavior. At higher V, I reached a plateau, until it dropped abruptly to zero around $V_g$~110 V. Previously, a gate voltage has been used to induce the same sign charge and create repulsive electrostatic forces between nanotubes in lateral contact, thereby breaking the contact between two nanotubes (see P. Kim et al., Science, 286 (1999) 2148, incorporated herein by reference). However, in the devices of the embodiments of the present invention this mechanism is unlikely because with the tapered geometry the electrostatic forces are unlikely to have a significant tensile component.

Another possibility is that the gate voltage places a bending stress on the nanotube that acts to break the con nection. The electrostatic force per unit length $F_{el}$ on the nanotube due to $V_{gate}$ is:

$$F_{el} = \frac{\pi \varepsilon V_{gate}^2}{h[\log(2)h/r)]} \qquad (1)$$

The maximum magnitude of the bending stress corresponding to $F_{el}$, (occurring at the mid-point of the nanotube) is:

$$\sigma_x = \frac{2F_{el}L^2}{\pi d^3} \qquad (2)$$

This is $\sim 10^{10}$ Pa for V=100V and typical values of d, L and h (d=5 nm, L=100 nm, h=300 nm). It is noted that the van der Waals forces would correspond to a binding stress of $\sim 10^6$ Pa, using the value for the inter-layer adhesion in graphite. Furthermore, gate-voltage switching is not anticipated for larger-diameter ($\sim$10-20 nm) MWNTs which have much larger diameters and greatly reduced bending stress. This suggests that the nanotube adhesion results from the formation of one or more covalent bonds between the atoms in the tube ends. It is also noted that this picture suggests the observed switching voltage can be reduced by optimization of the geometry such as using longer and thinner nanotubes, and decreasing the distance between the nanotube and the back gate.

Finally, using a core mass m$\sim$2$\times 10^{-19}$ kg corresponding to a nanotube of length 1 µm and core radius 5 nm, an accelerating force $\sim$5 nN, and a gap distance $\sim$5 nm, a switching speed $\sim$600 ps is estimated, comparable to silicon-based transistor technology. This could be reduced substantially in principle by using shorter core lengths and smaller diameter to decrease m.

Once the devices have been switched back to the OFF state, they may be switched again to the ON state by another application of a source-drain voltage. However, in all three samples studied showing reversible switching, the gap-closing voltage increases with successive cycles until the devices no longer switch ON after several ON-OFF switching cycles. Based on SEM studies, this is attributed to an increasing gap caused by loss of material. Thus, short pulses may be used to actuate the switch to minimize any ablated material.

In summary, a nanomechanical device contains a nanostructure located between two electrodes. The device switches from an OFF state to an ON state by extension of at least one inner shell of the nanostructure relative to at least one outer shell of the nanostructure. Thus, the nanomechanical device (which can also be referred to as a nanoelectromechanical device, since it operates on electricity) may be used in non-volatile memory devices that operate by using multi-walled nanotubes or other suitable nanostructures as a low-friction bearings. The devices are easy to fabricate in high yield and may go through several ON-OFF conductance cycles with a high ON/OFF ratio. Aside from using their use as nanoscale memories, their closing motion can exploited, for example, as adjustable-gap probes to make electrical contacts to other nanostructures.

Furthermore, the nanomechanical devices may also be used in other electronic devices, such as a nanomechanical oscillator, a signal mixer or a discriminator. A nanomechanical oscillator may comprise a ring oscillator in which a signal from one nanomechanical device turns on another nanomechanical device (i.e., an open circuit changed to a closed circuit in a first device provides a conductive path from a voltage source to a second device to actuate the second device). A signal mixer may comprise a circuit in which one high frequency signal modulates another high frequency signal. A discriminator may comprise a circuit which provides a first signal when a second signal reaches a predetermined magnitude. The nanomechanical devices may also be used in other circuits which ordinarily contain switching devices which switch from an on state to an off state. For example, since the three terminal nanomechanical devices function as reversible switches, similar to transistors, these nanomechanical devices may also be used in logic circuits, such as logic gates, where transistors are ordinarily used. Thus, the nanomechanical devices are somewhat similar to a semiconductor transistor (such as a MOSFET). However, the nanomechanical device operation differs from that of a semiconductor transistor because a transistor's behavior varies smoothly with its control signal, while the nanomechanical device's behavior varies abruptly (and potentially irreversibly) with its control signal.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

What is claimed is:

1. A method of operating a nanomechanical device, comprising:
providing a device comprising a multi-walled nanostructure, a first electrode and a second electrode, wherein the multi-walled nanostructure forms at least one of an open or a closed circuit between the first and the second electrodes; and performing at least one of:
(a) applying a voltage between the first and the second electrodes such that a first portion of the nanostructure moves relative to a second portion of the nanostructure to close the open circuit; or
(b) applying a gate voltage to a gate electrode located adjacent to the nanostructure such that at least a part of the nanostructure moves to open the closed circuit.

2. The method of claim 1, comprising:
providing the device comprising the multi-walled nanostructure, the first electrode and the second electrode, wherein the multi-walled nanostructure forms the open circuit between the first and the second electrodes; and
applying the voltage between the first and the second electrodes such that the first portion of the nanostructure moves relative to the second portion of the nanostructure to close the open circuit.

3. The method of claim 2, wherein:
a first segment of the nanostructure is electrically connected to the first electrode;
a second segment of the nanostructure is electrically connected to the second electrode;
the open circuit is caused by a gap between the first and the second segments of the nanostructure;
the first portion of the nanostructure comprises an inner portion of the nanostructure;
the second portion of the nanostructure comprises an outer portion of the nanostructure; and the step of applying the voltage causes the inner portion of the first segment to extend relative to the outer portion of the first segment and causes the inner portion of the second segment to extend relative to the outer portion of the second segment, such that the inner portion of the first segment contacts the inner portion of the second segment to electrically connect the first electrode to the second electrode.

4. The method of claim 3, wherein:
the nanostructure comprises a carbon multi-walled nanotube; and
the step of applying a voltage causes at least one inner shell of a first segment of the nanotube to extend relative to at least one outer shell of the first segment of the nanotube to contact at least one inner shell of a second segment of the nanotube.

5. The method of claim 2, wherein:
the nanostructure is electrically connected to the first electrode;
the open circuit is formed by a gap between the nanostructure and the second electrode; and
the step of applying the voltage causes an inner portion of the nanostructure to extend relative to an outer portion of the nanostructure, such that the inner portion of the nanostructure contacts the second electrode to electrically connect the first electrode to the second electrode.

6. The method of claim 5, wherein:
the nanostructure comprises a carbon multi-walled nanotube which is electrically connected to the first electrode; and
the step of applying a voltage causes at least one inner shell of the nanotube to extend relative to at least one outer shell of the nanotube to contact the second electrode.

7. The method of claim 1, further comprising:
providing an array of multi-walled nanostructures in a non-volatile memory device, wherein each nanostructure is located between respective electrodes; and
selectively applying a voltage to predetermined nanostructures in the array to form a closed circuit between the electrodes separated by the predetermined nanostructures to store information in the memory device.

8. The method of claim 1, comprising:
providing the device comprising the nanostructure, the first electrode, the second electrode and the gate electrode, wherein the multi-walled nanostructure forms the closed circuit between the first and the second electrodes; and
applying the gate voltage to the gate electrode located adjacent to the nanostructure such that at least a part of the nanostructure moves to open the closed circuit.

9. The method of claim 1, comprising:
providing a device comprising a multi-walled nanostructure, a first electrode and a second electrode, wherein the multi-walled nanostructure alternatively forms the open and the closed circuits between the first and the second electrodes;
applying the voltage between the first and the second electrodes such that the first portion of the nanostructure moves relative to the second portion of the nanostructure to close the open circuit; and
applying the gate voltage to the gate electrode located adjacent to the nanostructure such that at least a part of the nanostructure moves to open the closed circuit.

10. A multi-walled nanomechanical device, comprising:
a first electrode;
a second electrode; and
a multi-walled nanostructure located between the first and the second electrodes to form an open circuit between the first and the second electrodes;
wherein the nanostructure is positioned such that an inner portion of the nanostructure is adapted to extend relative to an outer portion of the nanostructure to close the open circuit upon an application of a voltage between the first and the second electrodes.

11. The device of claim 10, wherein:
a first segment of the nanostructure is electrically connected to the first electrode;
a second segment of the nanostructure is electrically connected to the second electrode;
the open circuit is caused by a gap between the first and the second segments of the nanostructure; and
the inner portion of the first segment is adapted to extend relative to the outer portion of the first segment and the inner portion of the second segment is adapted to extend relative to the outer portion of the second segment, such that the inner portion of the first segment contacts the inner portion of the second segment to electrically connect the first electrode to the second electrode.

12. The device of claim 10, wherein:
the nanostructure is electrically connected to the first electrode;
the open circuit is caused by a gap between the nanostructure and the second electrode; and
the inner portion of the nanostructure is adapted to extend relative to an outer portion of the nanostructure, such that the inner portion of the nanostructure contacts the second electrode to electrically connect the first electrode to the second electrode.

13. The device of claim 10, further comprising a first means for applying a voltage between the first electrode and the second electrode to extend the inner portion of the nanostructure relative to an outer portion of the nanostructure to close the open circuit.

14. The device of claim 10, wherein:
the nanostructure comprises a carbon multi-walled nanotube; and
an application of a voltage between the first electrode and the second electrode causes at least one inner shell of a first segment of the nanotube to extend relative to at least one outer shell of the first segment of the nanotube to contact at least one inner shell of a second segment of the nanotube.

15. The device of claim 10, wherein:
the nanostructure comprises a carbon multi-walled nanotube which is electrically connected to the first electrode; and
an application of a voltage between the first electrode and the second electrode causes at least one inner shell of the nanotube to extend relative to at least one outer shell of the nanotube to contact the second electrode.

16. A non-volatile memory, comprising:
an array of devices of claim 10, wherein each device comprises an antifuse; and
a bit line driver circuit adapted to selectively provide a voltage to form a link in predetermined antifuses in the array.

17. A non-volatile memory, comprising:
an array of devices of claim 10, wherein each device comprises a three terminal reversible fuse-antifuse device;
a bit line driver circuit adapted to selectively provide a voltage between the device electrodes to form a conductive link between the electrodes in predetermined devices in the array; and
a word line driver circuit adapted to selectively provide a voltage to predetermined gate electrodes to form an open circuit between electrodes in predetermined devices in the array.

18. A device, comprising a nanostructure located between two electrodes, wherein:
the device switches from an OFF state to an ON state by extension of at least one inner shell of the nanostructure relative to at least one outer shell of the nanostructure upon an application of a voltage between the electrodes; and
the device further switches from the ON state to the OFF state upon an application of a gate voltage to a gate electrode located adjacent to the nanostructures.

19. The device of claim 18, further comprising:
a first electrode;
a second electrode; and
a first means for applying the voltage between the first and the second electrodes to extend an inner portion of the nanostructure relative to an outer portion of the nanostructure to close an open circuit.

* * * * *